(12) United States Patent
Youssef et al.

(10) Patent No.: US 9,277,641 B2
(45) Date of Patent: Mar. 1, 2016

(54) ROUTING AND SHIELDING OF SIGNAL LINES TO IMPROVE ISOLATION

(71) Applicant: QUALCOMM Incorporated, San Diego, CA (US)

(72) Inventors: Ahmed Abdel Monem Youssef, San Diego, CA (US); Li-Chung Chang, Irvine, CA (US); Ehab Ahmed Sobhy Abdel Ghany, San Diego, CA (US); Rui Xu, San Diego, CA (US); Wingching Vincent Leung, San Diego, CA (US); Allen He, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 399 days.

(21) Appl. No.: 13/857,022

(22) Filed: Apr. 4, 2013

(65) Prior Publication Data
US 2014/0302802 A1    Oct. 9, 2014

(51) Int. Cl.
*H05K 1/02* (2006.01)
*H04B 3/02* (2006.01)
(Continued)

(52) U.S. Cl.
CPC .............. *H05K 1/0228* (2013.01); *H04B 3/02* (2013.01); *H05K 1/0219* (2013.01); *H04B 1/005* (2013.01); *H04B 1/44* (2013.01); *H04B 7/04* (2013.01); *H05K 2201/09245* (2013.01); *Y10T 307/74* (2015.04)

(58) Field of Classification Search
CPC .............. H05K 1/0216; H05K 1/0219; H05K 2201/09245; H03K 1/0228; H04B 1/44; H04B 1/055; H04B 3/02; H04B 7/04; Y10T 307/74

USPC .................... 333/1, 5, 12, 101, 262
See application file for complete search history.

(56) References Cited

U.S. PATENT DOCUMENTS 4,052,691 A   10/1977  Nagano et al.
4,057,691 A * 11/1977  Goto et al. ................ 379/292
(Continued)

FOREIGN PATENT DOCUMENTS

EP    1549118 A2    6/2005
JP    S62166614 A   7/1987
(Continued)

OTHER PUBLICATIONS

International Search Report and Written Opinion—PCT/US2014/032491—ISA/EPO—Jun. 20, 2014.

*Primary Examiner* — Benny Lee
*Assistant Examiner* — Jorge Salazar, Jr.
(74) *Attorney, Agent, or Firm* — Smith Risley Tempel Santos LLC (57) ABSTRACT

Techniques for routing and shielding signal lines to improve isolation between the signal lines are disclosed. In an exemplary design, an apparatus includes first, second, and third signal lines and a switch. The first, second, and third signal lines are configurable to carry first, second, and third signals, respectively. The switch is coupled between the second signal line and AC ground and is closed when the second signal line is not carrying the second signal. The second signal line isolates the first and third signal lines when the switch is closed. Adjacent signal lines are not active at the same time. A signal line may include positive and negative signal lines, which may have at least one cross over in order to cancel coupling between the positive and negative signal lines.

19 Claims, 8 Drawing Sheets

(51) Int. Cl.
  *H04B 1/44* (2006.01)
  *H04B 7/04* (2006.01)
  *H04B 1/00* (2006.01)

(56) References Cited

U.S. PATENT DOCUMENTS

| | | |
|---|---|---|
| 6,204,683 B1 | 3/2001 | Falconer |
| 7,032,122 B2 | 4/2006 | Ooishi |
| 7,715,869 B2 | 5/2010 | Takahashi et al. |
| 8,031,699 B2 | 10/2011 | Sin et al. |
| 2003/0099190 A1 | 5/2003 | Zerbe |
| 2007/0236303 A1 | 10/2007 | Lee et al. |
| 2008/0062296 A1 | 3/2008 | Ogura et al. |
| 2010/0289539 A1* | 11/2010 | Wu .................. 327/157 |
| 2010/0327976 A1 | 12/2010 | Klemens et al. |
| 2011/0038282 A1 | 2/2011 | Mihota et al. |
| 2012/0300416 A1 | 11/2012 | Saji et al. |
| 2012/0327825 A1 | 12/2012 | Gudem et al. |
| 2013/0043946 A1 | 2/2013 | Hadjichristos et al. |

FOREIGN PATENT DOCUMENTS

| | | |
|---|---|---|
| JP | H04218948 A | 8/1992 |
| WO | 0197391 A2 | 12/2001 |

* cited by examiner

ROUTING AND SHIELDING OF SIGNAL LINES TO IMPROVE ISOLATION

BACKGROUND

I. Field

The present disclosure relates generally to electronics, and more specifically to techniques for routing and shielding signal lines.

II. Background

An electronics device such as a wireless communication device or an integrated circuit (IC) may include various circuits to perform designed functions. These circuits are typically connected by signal lines via which various signals are passed between the circuits. The signal lines may also be referred to as routes, traces, interconnections, etc. Ideally, the circuits should be located close to each other so that the signal lines are as short as possible. Short signal lines may provide various advantages such as better signal quality of signals passed via the signal lines, less area to form the signal lines, etc. However, it is often not possible to maintain all signal lines short. Inevitably, some longer signal lines are required to connect some circuits located relatively far from each other. There may be coupling between signal lines, e.g., due to electro-magnetic coupling, capacitive coupling, etc. Hence, a signal may be sent on one signal line and may be coupled to one or more other signal lines. The signal may act as interference to other signals on other signal lines. It may be desirable to implement signal lines such that good isolation can be obtained.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for routing and shielding signal lines to improve isolation between the signal lines are disclosed herein. The techniques may be used for various electronic devices such as wireless devices.

Figure 1:
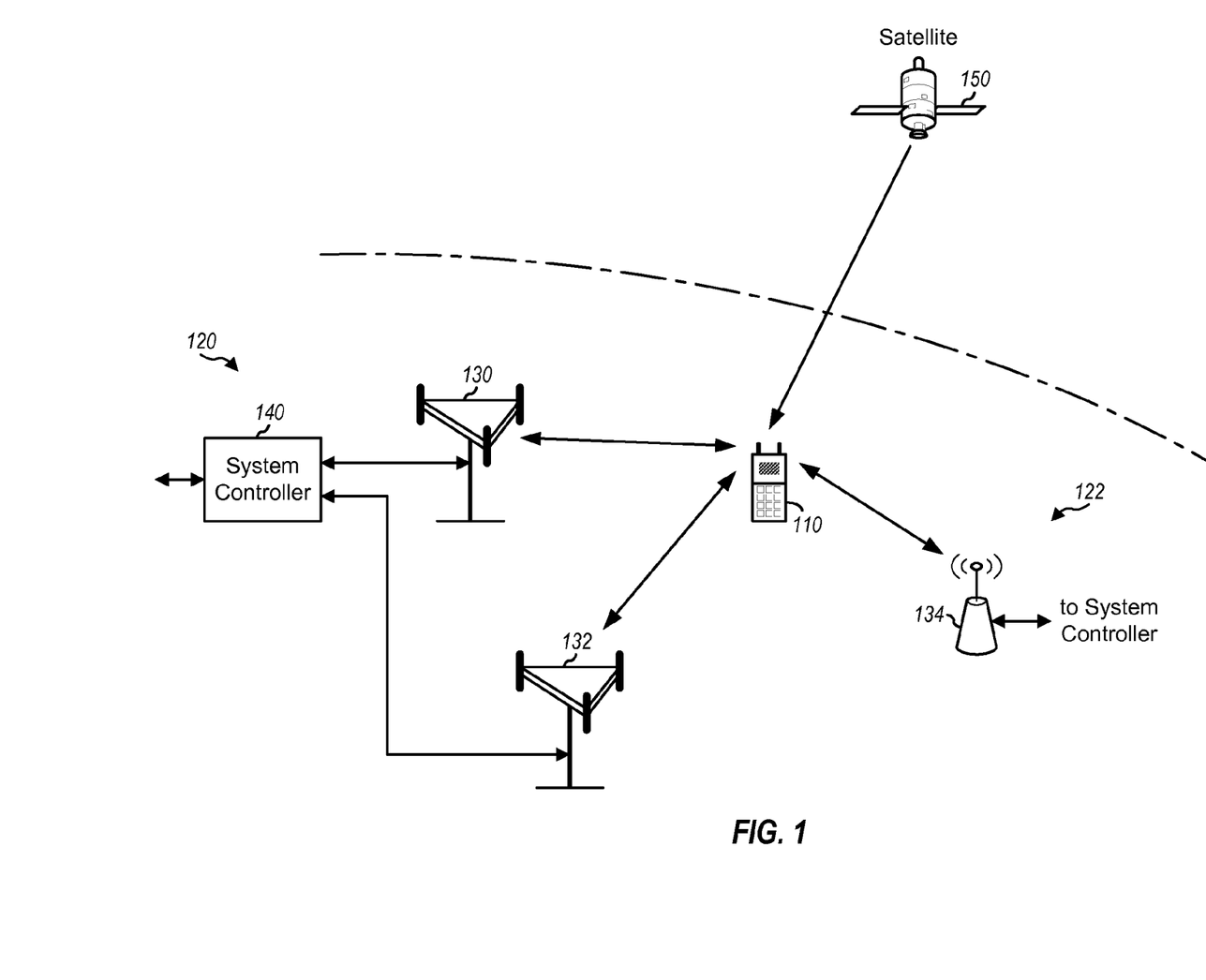
FIG. 1 shows a wireless device communicating with wireless systems.

FIG. 1 shows a wireless device 110 communicating with wireless communication systems 120 and 122. Each wireless system may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Time Division Synchronous CDMA (TD-SCDMA), or some other version of CDMA. For simplicity, FIG. 1 shows wireless system 120 including two base stations 130 and 132 and one system controller 140, and wireless system 122 including one base station 134. In general, a wireless system may include any number of base stations and any set of network entities. A base station may also be referred to as a Node B, an evolved Node B (eNB), an access point, etc.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120 and/or 122. Wireless device 110 may also receive signals from broadcast stations, signals from satellites (e.g., a satellite 150) in one or more global navigation satellite systems (GNSS), etc. Wireless device 110 may support one or more radio technologies for wireless communication such as LTE, WCDMA, CDMA 1x, TD-SCDMA, GSM, 802.11, etc.

Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz. LTE Release 11 supports 35 bands, which are referred to as LTE/UMTS bands and are listed in a publicly available document 3GPP TS 36.101. In general, any number of band groups may be defined. Each band group may cover any range of frequencies, which may or may not match any of the frequency ranges given above. Each band group may include any number of bands.

Wireless device 110 may support carrier aggregation, which is operation on multiple carriers. Carrier aggregation may also be referred to as multi-carrier operation. A carrier may refer to a range of frequencies used for communication and may be associated with certain characteristics. For example, a carrier may be associated with system information and/or control information describing operation on the carrier. A carrier may also be referred to as a component carrier (CC), a frequency channel, a cell, etc. A band may include one or more carriers. Each carrier may cover up to 20 MHz in LTE. Wireless device 110 may be configured with up to 5 carriers in one or two bands in LTE Release 11.

Carrier aggregation (CA) may be categorized into two types—intra-band CA and inter-band CA. Intra-band CA refers to operation on multiple carriers within the same band. Inter-band CA refers to operation on multiple carriers in different bands.

Wireless device 110 may concurrently receive multiple transmitted signals at different frequencies. These multiple transmitted signals may be sent by one or more base stations on multiple carriers at different frequencies for carrier aggregation. These multiple transmitted signals may also be sent by different base stations for coordinated multi-point (CoMP) transmission, handover, etc. These multiple transmitted signals may also be sent by base stations in different wireless systems for concurrent services such as voice/data, or data/data, or voice/voice, etc. For example, wireless device 110 may support dual SIM/dual standby (DSDS) and/or dual SIM/dual-active (DSDA) and may be able to concurrently communicate with multiple wireless systems such as TD-SCDMA and GSM systems, or LTE and GSM systems, or CDMA and GSM systems, etc.

Figure 2:
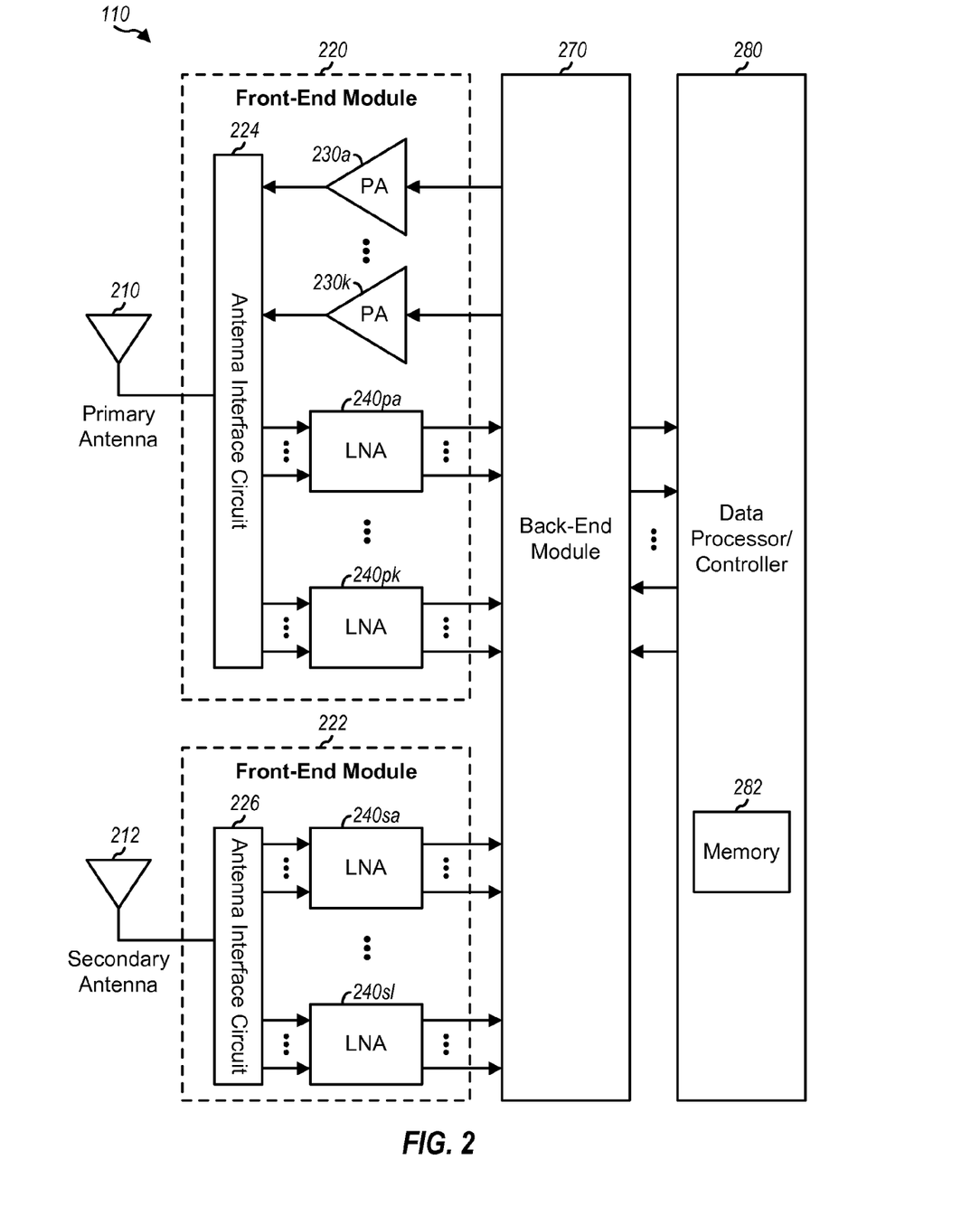
FIG. 2 shows a block diagram of the wireless device in FIG. 1.

FIG. 2 shows a block diagram of an exemplary design of wireless device 110 in FIG. 1. In this exemplary design, wireless device 110 includes a front-end module 220 coupled to a primary antenna 210, a front-end module 222 coupled to a secondary antenna 212, a back-end module 270, and a data processor/controller 280. Front-end modules 220 and 222 may support multiple bands, carrier aggregation, multiple radio technologies, receive diversity, multiple-input multiple-output (MIMO) transmission from multiple transmit antennas to multiple receive antennas, etc., or a combination thereof.

In the exemplary design shown in FIG. 2, front-end module 220 includes an antenna interface circuit 224, multiple (K) power amplifiers (PAs) 230a to 230k, and multiple (K) LNAs 240pa to 240pk. Antenna interface circuit 224 is coupled to primary antenna 210 and may include switches, duplexers, transmit filters, receive filters, matching circuits, etc. PAs 230a to 230k have their inputs coupled to back-end module 270 and their outputs coupled to antenna interface circuit 224. LNA 240pa to 240pk have their inputs coupled to antenna interface circuit 224 and their outputs coupled to back-end module 270. Each LNA 240 may be (i) a single-input single-output (SISO) LNA comprising a single input and a single output, or (ii) a single-input multiple-output (SIMO) LNA comprising a single input and multiple outputs, or (iii) a MIMO LNA comprising multiple inputs and multiple outputs.

In the exemplary design shown in FIG. 2, front-end module 222 includes an antenna interface circuit 226 and multiple (L) LNAs 240sa to 240sl. Antenna interface circuit 226 is coupled to secondary antenna 212 and may include switches, receive filters, matching circuits, etc. LNA 240sa to 240sl have their inputs coupled to antenna interface circuit 226 and their outputs coupled to back-end module 270.

Antenna interface circuit 224 may obtain a received RF signal from antenna 210 and may provide one or more input RF signals to one or more of LNAs 240pa to 240pk. Antenna interface circuit 224 may also receive an output RF signal from one power amplifier 230 and may provide the output RF signal to antenna 210. Antenna interface circuit 226 may obtain a received RF signal from antenna 212 and may provide one or more input RF signals to one or more of LNAs 240sa to 240sl.

Each LNA 240 may include (i) N inputs that can receive up to N input RF signals from antenna interface circuit 224 or 226 and (ii) M outputs that can provide up to M amplified RF signals to back-end module 270, where N≥1 and M≥1. LNA 240pa to 240pk and LNAs 240sa to 240sl may include (i) the same or different numbers of inputs and (ii) the same or different numbers of outputs. Hence, N and M may be the same for all LNAs 240 or different for different LNAs 240. An LNA with N inputs and M outputs may be referred to as an N×M LNA.

LNAs 240 may be used to receive transmissions on multiple carriers at different frequencies. An LNA may operate in a SISO mode, a SIMO mode, or a MIMO mode at any given moment. In the SISO mode, the LNA receives one input RF signal comprising one or more transmissions on one or more carriers in one band and provides one amplified RF signal. In the SIMO mode, the LNA receives one input RF signal comprising multiple transmissions on multiple sets of carriers (e.g., in the same band) and provides multiple amplified RF signals (e.g., one amplified RF signal for each set of carriers). In the MIMO mode, the LNA receives multiple input RF signals comprising multiple transmissions on multiple sets of carriers (e.g., on one or more bands) and provides multiple amplified RF signals for the multiple sets of carriers (e.g., one amplified RF signal for each set of carriers). Each set of carriers may include one or more carriers. Each carrier may have a bandwidth of 1.4, 2, 5, 10, 15 or 20 MHz in LTE.

The SISO mode may be used to support no carrier aggregation. In this case, a single LNA operating in the SISO mode may receive one input RF signal and provide one amplified RF signal. The SISO mode may also be used to support inter-band CA on multiple bands in one or multiple band groups. In this case, multiple LNAs may be used for the multiple bands, with each LNA operating in the SISO mode for one band. The SIMO mode may be used to support intra-band CA. The MIMO mode may be used to support inter-band CA in the same band group. In this case, a single LNA may receive multiple input RF signals for multiple bands in the same band group and may provide multiple amplified RF signals for the multiple bands.

Back-end module 270 may include various circuits to condition signals for transmission via antenna 210, such as amplifiers, filters, upconverters, matching circuits, oscillators, local oscillator (LO) generators, phase-locked loops (PLL), etc. Back-end module 270 may also include various circuits to condition signals received via antennas 210 and 212, such as downconverters, filters, amplifiers, matching circuits, oscillators, LO generators, PLLs, etc. Back-end module 270 may also include switches and signal lines to interconnect LNAs 240 to downconverters within back-end module 270, as described below. Back-end module 270 may also be referred to as a transceiver module.

Front-end modules 220 and 222 and back-end module 270 may be implemented in various manners. Modules 220, 222 and 270 may each be implemented on one or more analog ICs, RF ICs (RFICs), mixed-signal ICs, circuit modules, etc. For example, modules 220, 222 and 270 may each be implemented on a separate RFIC or circuit module. As another example, front-end modules 220 and 222 may be implemented on one RFIC, and back-end module 270 may be implemented on another RFIC. Front-end modules 220 and 222 and back-end module 270 may also be implemented in other manners.

Data processor/controller 280 may perform various functions for wireless device 110. For example, data processor 280 may perform processing for data being received by wireless device 110 and data being transmitted by wireless device 110. Controller 280 may control the operation of various circuits in front-end modules 220 and 222 and back-end module 270. A memory 282 may store program codes and data for data processor/controller 280. Data processor/controller 280 may be implemented on one or more application specific integrated circuits (ASICs) and/or other ICs.

Figure 3:
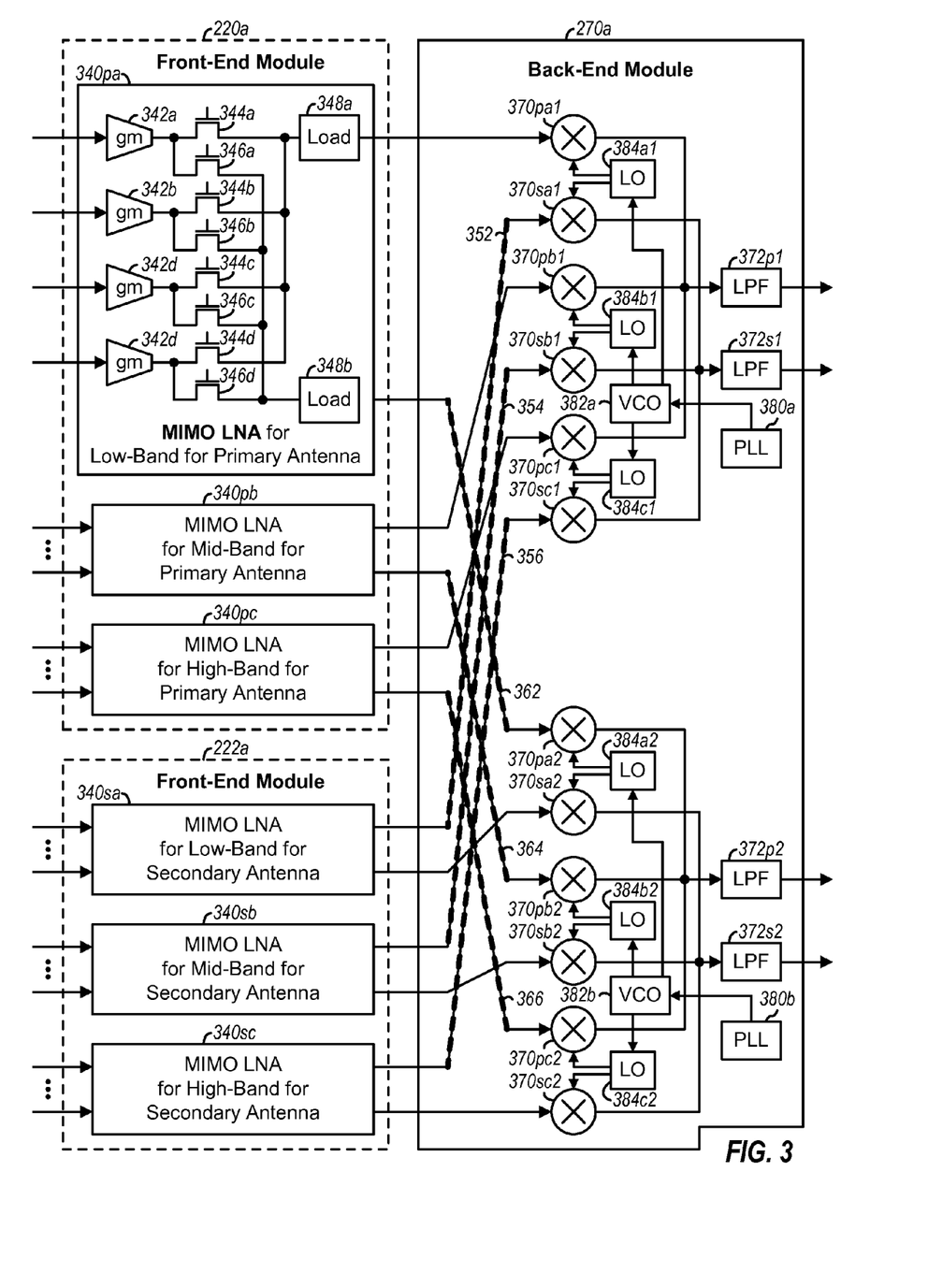
FIG. 3 shows a schematic diagram of an exemplary design of front-end and back-end modules within the wireless device.

FIG. 3 shows a schematic diagram of front-end modules 220a and 222a and a back-end module 270a, which are one exemplary design of front-end modules 220 and 222 and back-end module 270 in FIG. 2. In the exemplary design shown in FIG. 3, front-end module 220a includes three MIMO LNAs 340pa, 340pb and 340pc for primary antenna 220 for low-band, mid-band, and high-band, respectively. Front-end module 222a includes three MIMO LNAs 340sa, 340sb and 340sc for secondary antenna 222 for low-band, mid-band, and high-band, respectively. MIMO LNAs 340 are one exemplary design of LNAs 240 in FIG. 2.

In the exemplary design shown in FIG. 3, LNA 340pa is a 4×2 LNA with four inputs and two outputs. LNA 340pa includes four gain circuits 342a to 342d, eight cascode transistors 344a to 344d and 346a to 346d, and two load circuits 348a and 348b. Each gain circuit 342 may be implemented with a transistor having its gate receiving an input RF signal, its source coupled to circuit ground either directly or via a source degeneration inductor, and its drain coupled to the output of the gain circuit. Gain circuits 342a to 342d may be used for four bands in low-band and may be coupled to four duplexers or matching circuits within antenna interface circuit 224. Antenna interface circuit 224 may provide one or two input RF signals to one or two of gain circuits 342a to 342d. Cascode transistors 344a to 344d have their sources coupled to the output of gain circuits 342a to 342d, respectively, and their drains coupled to load circuit 348a. Cascode transistors 346a to 346d have their sources coupled to the output of gain circuits 342a to 342d, respectively, and their drains coupled to load circuit 348b. Cascode transistors 344a to 344d and 346a to 346d receive different control signals, and each cascode transistor 344 or 346 may be turned ON or OFF based on its control signal. Load circuit 348a provides a first amplified RF signal for a first set of carriers in low-band. Load circuit 348b provides a second amplified RF signal for a second set of carriers in low-band.

FIG. 3 shows an exemplary design of 4×2 LNA 340pa. In general, an N×M LNA may have N inputs and M outputs and may include N gain circuits, up to N*M cascode transistors, and M load circuits. The cascode transistors may be used to interconnect the N gain circuits to the M load circuits. Full interconnection may be obtained by using N*M cascode transistors to connect each gain circuit to each load circuit. Partial interconnection may be obtained by connecting a subset of the gain circuits (instead of all N gain circuits) to each load circuit.

LNAs 340pb, 340pc, 340sa, 340sb and 340sc may be implemented in similar manner as LNA 340pa in FIG. 3. The N×M dimension of each LNA 340 may be dependent on various factors such as the number of bands supported in each band group, the number of sets of carriers on which transmissions may be sent simultaneously to wireless device 110, the number of available input/output (I/O) pins, etc.

In the exemplary design shown in FIG. 3, back-end module 270a includes six pairs of downconverters (DC), as follows:
First pair of downconverters 370pa1 and 370sa1 for first carrier set in low-band,
Second pair of downconverters 370pb1 and 370sb1 for first carrier set in mid-band,
Third pair of downconverters 370pc1 and 370sc1 for first carrier set in high-band,
Fourth pair of downconverters 370pa2 and 370sa2 for second carrier set in low-band,
Fifth pair of downconverters 370pb2 and 370sb2 for second carrier set in mid-band, and
Sixth pair of downconverters 370pc2 and 370sc2 for second carrier set in high-band.

Downconverters 370pa1, 370pb1 and 370pc1 are for primary antenna 310 for a first set of carriers (or a first carrier set) in low-band, mid-band, and high-band, respectively. Downconverters 370pa1, 370pb1 and 370pc1 have (i) their inputs coupled to first outputs of LNAs 340pa, 340pb, and 340pc, respectively, and (ii) their outputs coupled together and to the input of a lowpass filter (LPF) 372p1. Downconverters 370sa1, 370sb1 and 370sc1 are for secondary antenna 312 for the first carrier set in low-band, mid-band, and high-band, respectively. Downconverters 370sa1, 370sb1 and 370sc1 have (i) their inputs coupled to first outputs of LNAs 340sa, 340sb, and 340sc, respectively, and (ii) their outputs coupled together and to the input of a lowpass filter 372s1. Lowpass filter 372p1 receives and filters a downconverted signal from downconverters 370pa1, 370pb1 or 370pc1 and provides a first output baseband signal for the first carrier set for primary antenna 210. Lowpass filter 372s1 receives and filters a downconverted signal from downconverters 370sa1, 370sb1 or 370sc1 and provides a second output baseband signal for the first carrier set for secondary antenna 212.

Downconverters 370pa2, 370pb2, 370pc2, 370sa2, 370sb2, and 370sc2 and lowpass filters 372p2 and 372s2 are for a second set of carriers (or a second carrier set) and are coupled in similar manner as downconverters 370pa1, 370pb1, 370pc1, 370sa1, 370sb1, and 370sc1 and lowpass filters 372p1 and 372s1 for the first carrier set.

In the exemplary design shown in FIG. 3, back-end module 270a further includes (i) a PLL 380a, a voltage-controlled oscillator (VCO) 382a, and LO generators ("LO") 384a1, 384b1 and 384c1 for the first carrier set and (ii) a PLL 380b, a VCO 382b, and LO generators 384a2, 384b2 and 384c2 for the second carrier set. VCO 382a generates a first VCO signal at a first VCO frequency and is controlled by PLL 380a. LO generator 384a1 generates LO signals at a first frequency in low-band for downconverters 370pa1 and 370sc1. LO generator 384b1 generates LO signals at a second frequency in mid-band for downconverters 370pb1 and 370sb1. LO generator 384c1 generates LO signals at a third frequency in high-band for downconverters 370pc1 and 370sc1. VCO 382b generates a second VCO signal at a second VCO frequency and is controlled by PLL 380b. LO generator 384a2 generates LO signals at a fourth frequency in low-band for downconverters 370pa2 and 370sa2. LO generator 384b2 generates LO signals at a fifth frequency in mid-band for downconverters 370pb2 and 370sb2. LO generator 384c2 generates LO signals at a sixth frequency in high-band for downconverters 370pc2 and 370sc2.

In the exemplary design shown in FIG. 3, back-end module 270a includes six downconverter pairs to support signal reception from up to two antennas for up to two sets of carriers in up to three band groups, or 2×2×3=12 downconverters. Each downconverter pair includes two downconverters 370 for two antennas 210 and 212 for one carrier set in one band. The two downconverters 370 in each pair receive LO signals at the same frequency from an associated LO generator 384. The two downconverters 370 in each pair may be placed close together in order to (i) shorten the routing of LO signal lines between the associated LO generator 384 and the two downconverters 370 and (ii) save power of LO generator 384. Furthermore, the three downconverter pairs for each carrier set may be placed close together in order to (i) shorten the routing of VCO signal lines between the associated VCO 382 and the three LO generators 384 for the carrier set and (ii) save power of LO generator 384.

The two downconverters 370 in each pair are coupled to two LNAs 340—one LNA 340 within transceiver 220a and one LNA 340 within transceiver 222a. LNAs 340pa, 340pb, and 340*pc* may be located close to antenna 210, and LNAs 340*sa*, 340*sb*, and 340*sc* may be located close to antenna 212 in order to shorten signal lines between the antennas and the LNAs. One or both downconverters in each pair may be routed via a relatively long signal line to LNAs 340. For example, downconverters 370*pa*1 and 370*sa*1 for the first carrier set may be placed close together in order to shorten the signal lines from LO generator 384*a*1 to downconverters 370*pa*1 and 370*sa*1. Downconverter 370*pa*1 may be coupled to LNA 340*pa* via a relatively short signal line. However, downconverter 370*sa*1 may be coupled to LNA 340*sa* via a relatively long signal line. As shown in FIG. 3, there may be six long signal lines 352, 354, 356, 362, 364 and 366 between downconverters 370*sa*1, 370*sb*1, 370*sc*1, 370*pa*2, 370*pb*2 and 370*pc*2 and their associated LNAs 340*sa*, 340*sb*, 340*sc*, 340*pa*, 340*pb* and 340*pc*, respectively. The six long signal lines are shown by heavy dashed lines in FIG. 3.

Figure 4:
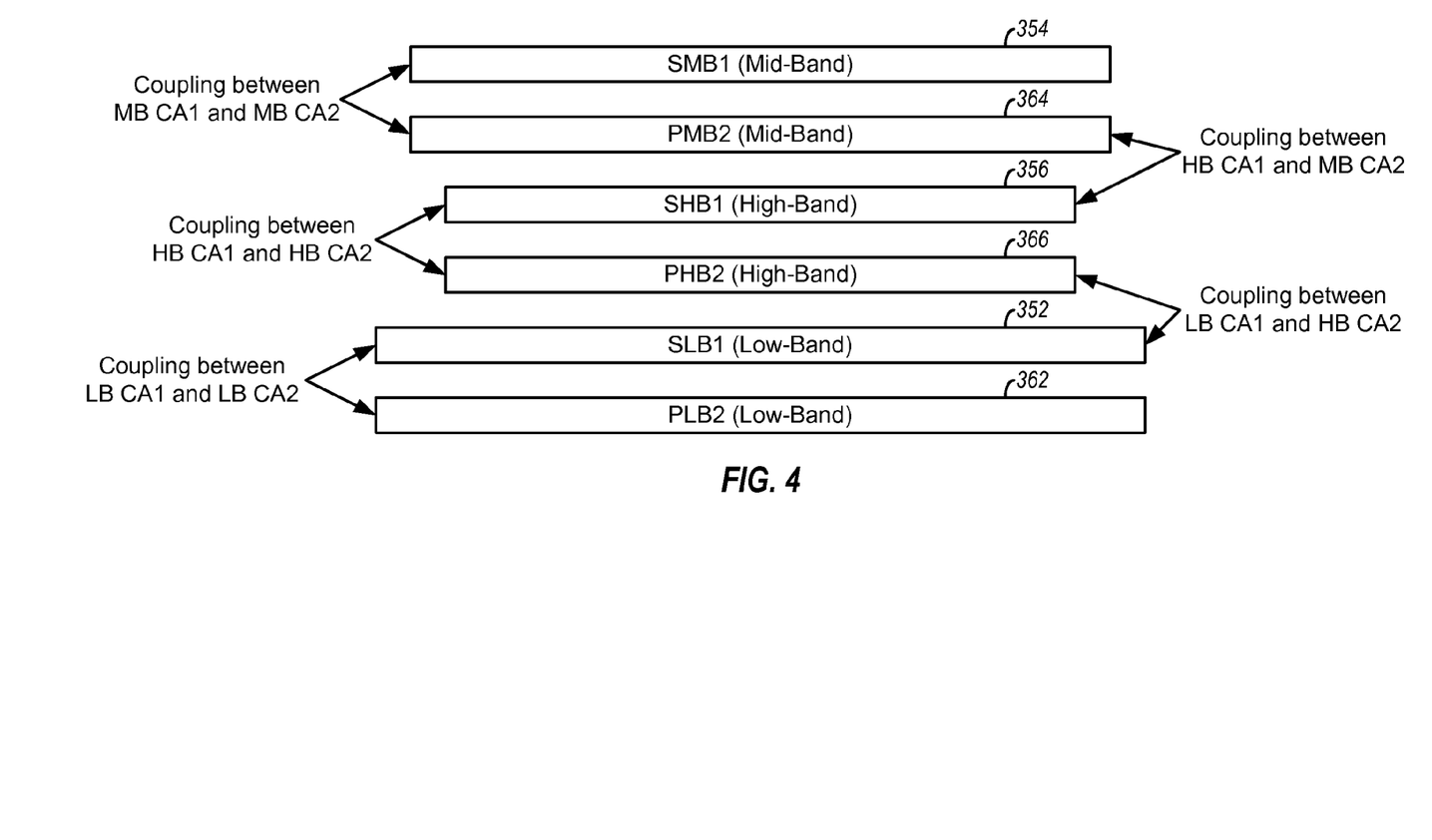
FIG. 4 shows an exemplary layout of six signal lines.

FIG. 4 shows a top view of an exemplary layout of the six long signal lines 352, 354, 356, 362, 364 and 366 in FIG. 3. For simplicity, FIG. 4 shows only a portion of the six long signal lines and does not show cross over between these signal lines. FIG. 4 shows possible coupling that might occur due to running the six long signal lines across an IC chip. In FIG. 4, a signal line is denoted as "xyyz". The first letter "x" may be either "P" for primary antenna 210 or "S" for secondary antenna 212. The next two letters "yy" may be "LB" for low-band, "MB" for mid-band, or "HB" for high-band. The last digit "z" may be either "1" for first carrier set (also denoted as CA1) or "2" for second carrier set (also denoted as CA2). The six long signal lines 352, 354, 356, 362, 364 and 366 are referred to as SLB1, SMB1, SHB1, PLB2, PMB2 and PHB2, respectively. For example, signal line 364 PMB2 is coupled between LNA 340*pb* and downconverter 370*pb*2 and carries an amplified RF signal for the second carrier set in mid-band for primary antenna 210.

In the exemplary design shown in FIG. 4, two long signal lines for each band group are located next to each other. Signal lines 356 and 366 for high-band are located in the center. Signal lines 352 and 362 for low-band are located on one side of signal lines 356 and 366 for high-band. Signal lines 354 and 364 for mid-band are located on the other side of signal lines 356 and 366 for high-band.

There may be coupling between adjacent long signal lines. For example, in the exemplary design shown in FIG. 4, there may be coupling (i) between signal lines 354 and 364, e.g., for inter-band CA between two bands in mid-band or intra-band CA within a band in mid-band, (ii) between signal lines 364 and 356, e.g., for inter-band CA between two bands in mid-band and high-band, (iii) between signal lines 356 and 366, e.g., for inter-band CA between two bands in high-band or intra-band CA within a band in high-band, (iv) between signal lines 366 and 352, e.g., for inter-band CA between two bands in high-band and low-band, and (v) between signal lines 352 and 362, e.g., for inter-band CA between two bands in low-band or intra-band CA within a band in low-band. RF signals may be sent concurrently on two long signal lines located next to each other. Coupling between adjacent signal lines may result in performance degradation.

In an aspect of the present disclosure, isolation between signal lines may be improved by (i) locating signal lines that are not concurrently active next to each other and (ii) shorting inactive signal lines to alternating current (AC) ground via switches and using the shorted signal lines as a shield to provide isolation between active signal lines. An active signal line is a signal line carrying a signal, and an inactive signal line is a signal line not carrying a signal. Reusing inactive signal lines to improve isolation between active signal lines may substantially reduce circuit area if the signal lines are implemented on an IC chip or substantially reduce package size if the signal lines are implemented on a printed circuit board (PCB), since ground lines are not needed to provide isolation between signal lines.

In general, a plurality of signal lines may be present, and RF signals may be concurrently sent on only certain combinations of the signal lines. For each signal line, other signal lines that are not concurrently active with that signal line may be identified. Table 1 lists an example of valid combinations for one signal line PLB2 among the six long signal lines shown in FIGS. 3 and 4. Two signal lines are (i) a valid combination if RF signals can be sent concurrently on these signal lines or (ii) an invalid combination if RF signals are not sent concurrently on these signal lines.

TABLE 1

| Signal Line X | Signal Line Y | Valid Combination |
|---|---|---|
| PLB2 | PLB1 | No |
| PLB2 | PMB2 | No |
| PLB2 | PHB2 | No |
| PLB2 | SLB1 | Yes |
| PLB2 | SMB1 | Yes |
| PLB2 | SHB1 | Yes |

Figure 5A:
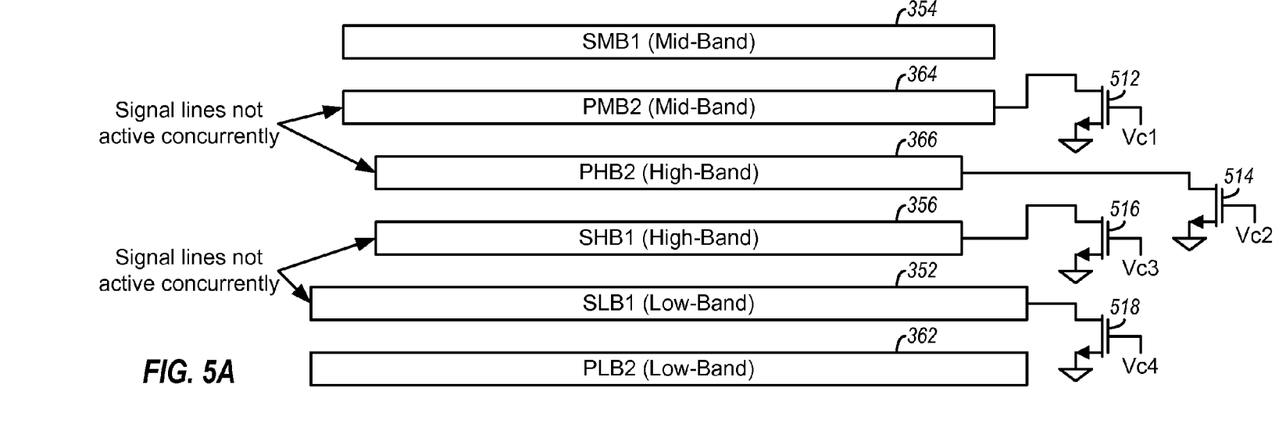
FIGS. 5A and 5B show two exemplary designs of routing and shielding signal lines to improve isolation.

FIG. 5A shows a top view of an exemplary design of routing and shielding six long signal lines 352, 354, 356, 362, 364 and 366 in FIG. 3 in a manner to improve isolation between the signal lines. For simplicity, FIG. 5A shows only a portion of the six long signal lines and does not show cross over between these signal lines. The six long signal lines 352 to 366 are arranged such that (i) the two long signal lines for each band group are located next to each other and (ii) signal lines that are not active concurrently are located next to each other. In the example shown in FIG. 5A, signal lines 352 and 362 for low-band are located next to each other, signal lines 354 and 364 for mid-band are located next to each other, and signal lines 356 and 366 for high-band are located next to each other. Signal lines 364 and 366 are not active concurrently, and signal lines 356 and 352 are not active concurrently. In general, some combinations of signal lines may not be active concurrently. Signal lines that are not active concurrently may be located next to each other, and RF signals would not be sent concurrently on adjacent signal lines.

In the exemplary design shown in FIG. 5A, a switch is coupled between each of the four middle signal lines 364, 366, 356 and 352 and AC ground. AC ground may be circuit ground, a power supply voltage (Vdd), or some other signal plane with good conductivity. Each switch may be implemented with an N-channel metal oxide semiconductor (NMOS) transistor (as shown in FIG. 5A) or with a transistor of some other type. In particular, an NMOS transistor 512 has its source coupled to circuit ground, its gate receiving a first control signal (Vc1), and its drain coupled to signal line 364. An NMOS transistor 514 has its source coupled to circuit ground, its gate receiving a second control signal (Vc2), and its drain coupled to signal line 366. An NMOS transistor 516 has its source coupled to circuit ground, its gate receiving a third control signal (Vc3), and its drain coupled to signal line 356. An NMOS transistor 518 has its source coupled to circuit ground, its gate receiving a fourth control signal (Vc4), and its drain coupled to signal line 352.

Figure 5B:
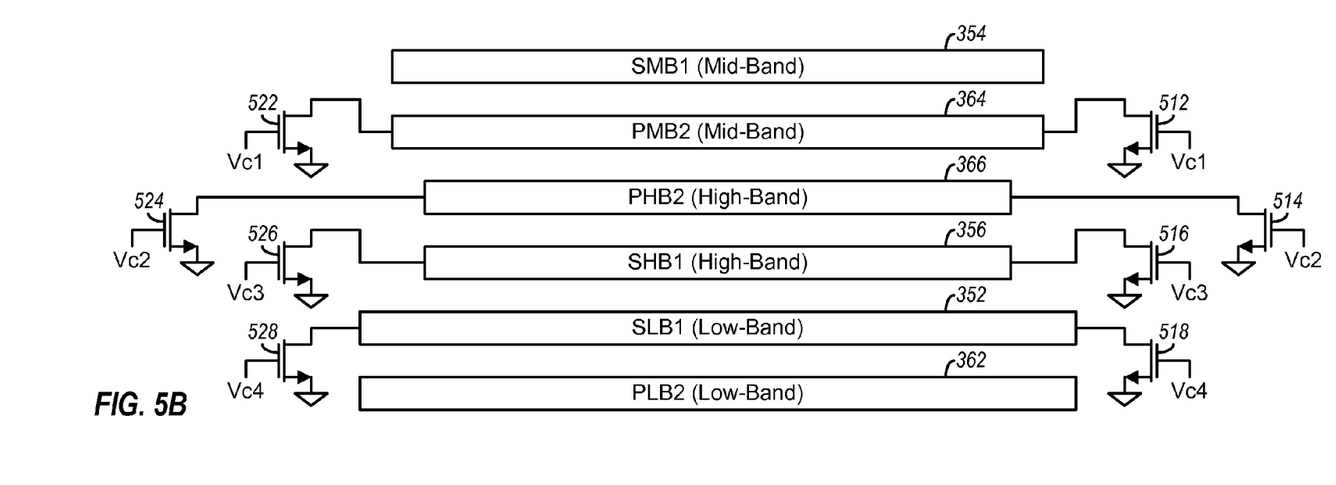

FIG. 5B shows a top view of another exemplary design of routing and shielding six long signal lines 352, 354, 356, 362, 364 and 366 in a manner to improve isolation between the signal lines. In the exemplary design shown in FIG. 5B, two switches are coupled to the two ends of each of the four middle signal lines 364, 366, 356 and 352, and each switch is coupled between a signal line and AC ground. In particular, NMOS transistors 512, 514, 516 and 518 are coupled between a first end of signal lines 364, 366, 356 and 352, respectively, and AC ground, as described above for FIG. 5A. Furthermore, NMOS transistors 522, 524, 526 and 528 are coupled between a second end of signal lines 364, 366, 356 and 352, respectively, and AC ground.

For each signal line, both NMOS transistors coupled to that signal line may be (i) turned ON when the signal line is inactive or (ii) turned OFF when the signal line is active. For example, both NMOS transistors 512 and 522 may be (i) turned ON when signal line 364 is inactive in order to improve isolation for inter-band CA between high-band and mid-band or (ii) turned OFF when signal line 364 is active. Shorting both ends of an inactive signal line to AC ground may improve isolation between active signal lines on both sides of the inactive signal line.

In general, any number of switches may be coupled between a signal line and AC ground. The number of switches coupled to the signal line may be dependent on various factors such as the length of the signal line, the loading presented by the switches on the signal line, the desired amount of isolation between active signal lines on both sides of the signal line, etc. More switches may provide better connection between the signal line and AC ground, which may improve isolation between active signal lines on both sides of the signal line. Multiple signal lines may be coupled to AC ground via the same number of switches, e.g., one or two switches for each signal line. Alternatively, multiple signal lines may be coupled to AC ground via different numbers of switches, e.g., more switches for a longer signal line, and vice versa.

FIGS. 5A and 5B show exemplary designs in which the two signal lines on the two outer ends are not coupled to AC ground via switches, and each signal line in the middle is coupled to AC ground via one or more respective switches. Signal lines may be coupled to AC ground via switches in other manners. In another exemplary design, one or more switches may be coupled between signal line 354 and AC ground and/or one or more switches may be coupled between signal line 362 and circuit ground. In yet another exemplary design, only some (instead of all) signal lines in the middle may be coupled to AC ground via switches.

One or more signal lines may be active at any given moment, and an RF signal may be sent on each active signal line. Signal lines that are not active may have their switches closed, which would then short these inactive signal lines to AC ground. A switch may be closed by applying a high voltage (e.g., Vdd) at the gate of an NMOS transistor implementing the switch. The high voltage would turn ON the NMOS transistor and pull an associated signal line to circuit ground. The shorted signal line may act as a shield to isolate signal lines that are active. For example, signal line 356 may be inactive and may be shorted to AC ground by turning ON either NMOS transistor 516 in FIG. 5A or NMOS transistors 516 and 526 in FIG. 5B. Signal line 356 may then act as a shield and may improve isolation between signal lines 366 and 352.

Figure 6:
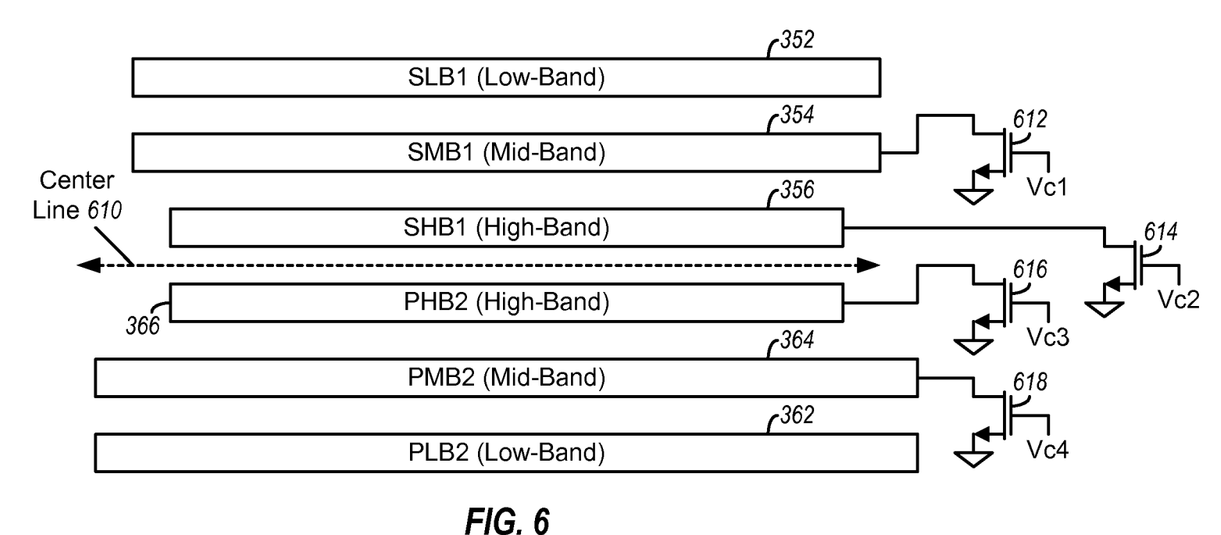
FIG. 6 shows another exemplary design of routing and shielding signal lines to improve isolation.

FIG. 6 shows a top view of another exemplary design of routing and shielding six long signal lines 352, 354, 356, 362, 364 and 366 in a manner to improve isolation between the signal lines. The six long signal lines 352 to 366 are arranged such that (i) the two long signal lines for each band group are located symmetrically about a center line 610 and (ii) signal lines that are not active concurrently are located next to each other. In the example shown in FIG. 6, signal lines 356 and 366 for high-band are located on both sides of center line 610. Signal lines 354 and 364 for mid-band are located outside of signal lines 356 and 366 and symmetric about center line 610. Signal lines 352 and 362 for low-band are located outside of signal lines 354 and 364 and symmetric about center line 610.

In the exemplary design shown in FIG. 6, an NMOS transistor 612 is coupled between signal line 354 and AC ground, an NMOS transistor 614 is coupled between signal line 356 and AC ground, an NMOS transistor 616 is coupled between signal line 366 and AC ground, and an NMOS transistor 618 is coupled between signal line 364 and AC ground. FIG. 6 shows an exemplary design in which one switch is coupled between a signal line and AC ground. Multiple switches may also be coupled between a signal line and AC ground.

Symmetric placement of the signal lines for each band group (e.g., as shown in FIG. 6) may (i) improve isolation between the signal lines for the same band group (except for the two signal lines in the middle) and (ii) improve isolation between signal lines for different band groups such as low-band and mid-band, low-band and high-band, and mid-band and high-band. For example, improved isolation may be obtained between signal lines 354 and 364 for mid-band and between signal lines 352 and 362 for low-band.

In another aspect of the present disclosure, cross over may be used to cancel coupling between a pair of complementary signal lines. A signal line for one carrier in one band group (e.g., signal line 362) may be a differential signal line comprising two complementary signal lines, which may include a positive signal line and a negative signal line. A cross over is a swap of the position of two complementary signal lines. For example, a positive signal line may be located on a first side of a negative signal line prior to a cross over, may swap position with the negative signal line at the cross over, and may be located on a second/opposite side of the negative signal line after the cross over. Cross over between the positive and negative signal lines may be used to cancel coupling between these complementary signal lines.

Figure 7:
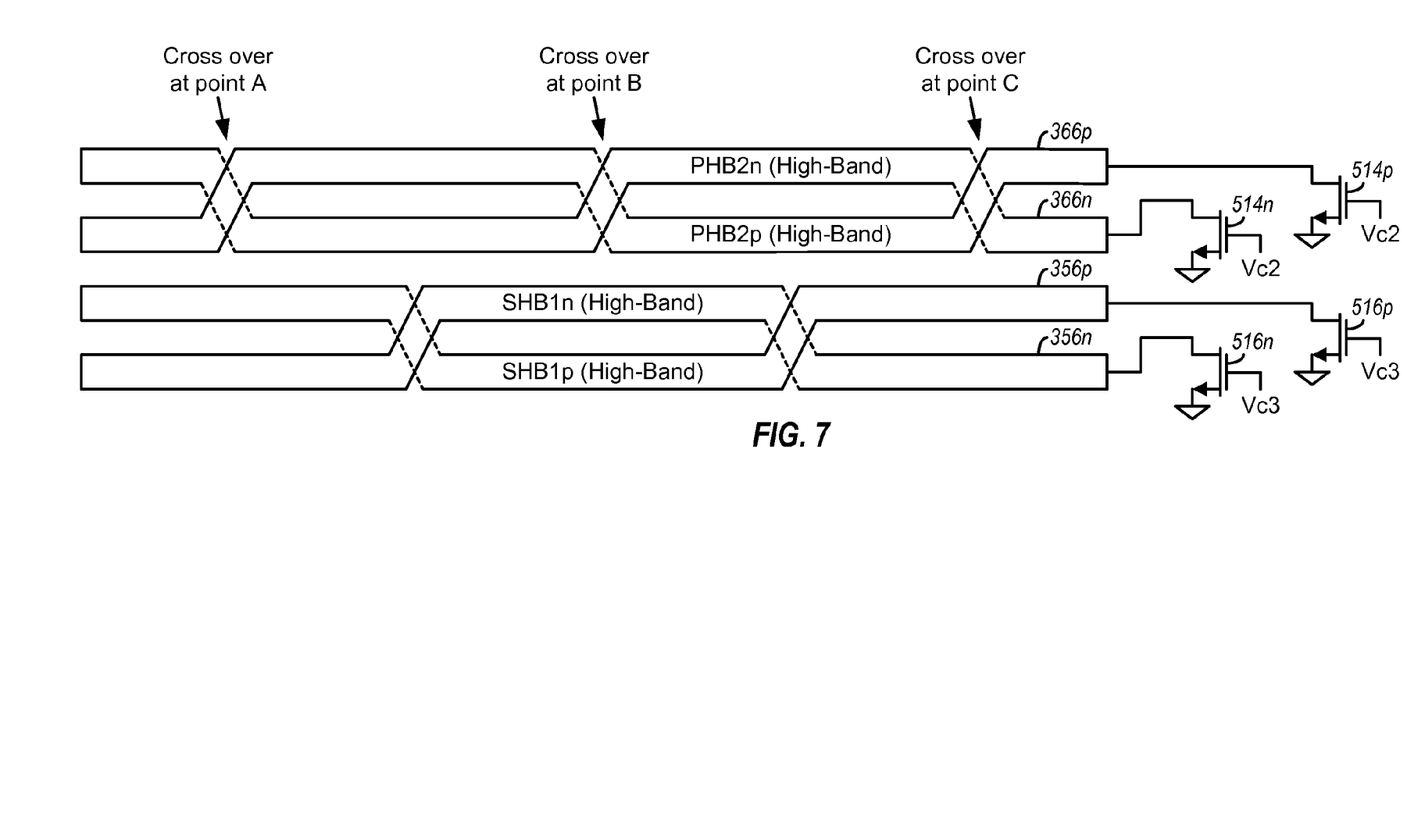
FIG. 7 shows an exemplary design of routing signal lines with cross over to improve isolation.

FIG. 7 shows a top view of an exemplary design of routing signal lines with cross over to improve isolation between adjacent signal lines. In the example shown in FIG. 7, signal line 366 for high-band includes complementary signal lines 366p and 366n, which are located next to each other. Signal line 356 for high-band includes complementary signal lines 356p and 356n, which are located next to each other. Other signal lines for low-band and mid-band are not shown in FIG. 7 for simplicity. Each pair of complementary signal lines periodically cross over in order to cancel coupling (e.g., differentially) between these two complementary signal lines. In particular, complementary signal lines 366p and 366n for high-band cross over at points A, B and C to cancel coupling between these two complementary signal lines. Similarly, complementary signal lines 356p and 356n for high-band cross over at multiple points.

In the exemplary design shown in FIG. 7, NMOS transistors 514p, 514n, 516p and 516n may be coupled between one end of signal lines 366p, 366n, 356p and 356n, respectively, and AC ground. Although not shown in FIG. 7, additional NMOS transistors may be coupled between the other end of signal lines 366p, 366n, 356p and 356n and AC ground, e.g., as shown in FIG. 5B.

In general, cross coupling may be used for any differential signal line to reduce coupling to the differential signal line. In the exemplary design shown in FIG. 6, cross coupling may be used for two differential signal lines 356 and 366. Cross coupling may not be needed for signal lines 354 and 364 for mid-band, which are separated by signal lines 356 and 366. Similarly, cross coupling may not be needed for signal lines 352 and 362 for low-band, which are separated by signal lines 354, 356, 364 and 366. Fewer cross over may be used (e.g., for only signal lines 356 and 366) in the exemplary design shown in FIG. 6, which may result in less parasitics capacitance being introduced due to cross coupling.

In general, a pair of complementary signal lines may have any number of cross over, and each cross over may be located anywhere along the routing of the signal lines. In an exemplary design, one pair of complementary signal lines (e.g., complementary signal lines 366p and 366n in FIG. 7) may have an even number of cross over, and an adjacent pair of complementary signal lines (e.g., complementary signal lines 356p and 356n in FIG. 7) may have an odd number of cross over. This exemplary design may improve cancellation of coupling between the two complementary signal lines in each pair.

The routing and shielding techniques disclosed herein may provide various advantages. First, the techniques may improve isolation between signal lines. For example, the techniques may provide 30 decibels (dB) or more of improvement in isolation and may achieve 50 dB or more of isolation between signal lines. The improved isolation may improve performance. Second, the techniques may reduce circuit area needed to implement signal lines. This may reduce the size and cost of an electronics device. The techniques may be especially advantageous for a wireless device with many signal lines, e.g., to support carrier aggregation on multiple band groups and/or multiple antennas.

In an exemplary design, an apparatus may include first, second, and third signal lines and a switch. The first signal line (e.g., signal line 366 in FIG. 5A or signal line 354 in FIG. 6) may be configurable to carry a first signal. The second signal line (e.g., signal line 356 in FIG. 5A or 6) may be configurable to carry a second signal and may be located between the first and third signal lines. The third signal line (e.g., signal line 352 in FIG. 5A or signal line 366 in FIG. 6) may be configurable to carry a third signal. The switch (e.g., NMOS transistor 516 in FIG. 5A or NMOS transistor 614 in FIG. 6) may be coupled between the second signal line and AC ground. The switch may be closed when the second signal line is not carrying the second signal. The second signal line may isolate the first and third signal lines when the switch is closed.

The apparatus may further include a second switch (e.g., NMOS transistor 526 in FIG. 5B) coupled between the second signal line and AC ground. The switch may be located at or near a first end of the second signal line. The second switch may be located at or near a second end of the second signal line. The switch and the second switch may both be closed when the second signal line is not carrying the second signal. In general, any number of switches may be coupled between the second signal line and AC ground.

In an exemplary design, adjacent signal lines are not active at the same time. For example, the first and second signal lines may not be active concurrently, and the second and third signal lines may not be active concurrently. In an exemplary design, each signal line may carry a signal from an amplifier (e.g., an LNA) to a downconverter. The first signal line may carry the first signal from a first amplifier to a first downconverter, e.g., when the first amplifier is enabled. The second signal line may carry the second signal from a second amplifier to a second downconverter, e.g., when the second amplifier is enabled. The third signal line may carry the third signal from a third amplifier to a third downconverter, e.g., when the third amplifier is enabled. In an exemplary design, the first, second, and third amplifiers and the first, second, and third downconverters are implemented on the same IC chip. In another exemplary design, the first, second, and third amplifiers are implemented on a first IC chip, and the first, second, and third downconverters are implemented on a second IC chip.

In an exemplary design, the apparatus may further include a fourth signal line (e.g., signal line 362 in FIG. 5A or signal line 364 in FIG. 6) configurable to carry a fourth signal. The third signal line may be located between the second and fourth signal lines. In an exemplary design, signal lines for each band group may be located adjacent to one another, e.g., as shown in FIG. 5A. For example, the first and second signal lines (e.g., signal lines 366 and 356 in FIG. 5A) may carry the first and second signals for two antennas for a first band group (e.g., high-band). The third and fourth signal lines (e.g., signal lines 352 and 362 in FIG. 5A) may carry the third and fourth signals for the two antennas for a second band group (e.g., low-band). In another exemplary design, signal lines for each band group may be located symmetric about a center line, e.g., as shown in FIG. 6. In this exemplary design, the second and third signal lines (e.g., signal lines 356 and 366 in FIG. 6) may carry the second and third signals for two antennas for the first band group. The first and fourth signal lines (e.g., signal lines 354 and 364 in FIG. 6) may carry the first and fourth signals for the two antennas for the second band group.

In an exemplary design, the apparatus may further include fifth and sixth signal lines. The fifth signal line (e.g., signal line 354 in FIG. 5A) may carry a fifth signal. The sixth signal line (e.g., signal line 364 in FIG. 5A) may carry a sixth signal. The first through sixth signal lines may include a first pair of signal lines for a first band group, a second pair of signal lines for a second band group, and a third pair of signal lines for a third band group.

In an exemplary design, the apparatus may further include a second switch (e.g., NMOS transistor 518 in FIG. 5A) coupled between the third signal line and AC ground. The second switch may be closed when the third signal line is not carrying the third signal. The third signal line may isolate the second and fourth signal lines when the second switch is closed.

The first, second, third and fourth signal lines may each be a differential signal line comprising a positive signal line and a negative signal line. In an exemplary design, the positive and negative signal lines (e.g., signal lines 366p and 366n in FIG. 7) for the first signal line may have at least one cross over (e.g., an even number of cross over) in order to cancel coupling between the positive and negative signal lines. Positive and negative signal lines (e.g., signal lines 356p and 356n in FIG. 7) for the second signal line may also have at least one cross over (e.g., an odd number of cross over). The first and fourth signal lines may also be separated by the second and third signal lines and may not have any cross over.

In an exemplary design, the switch may comprise an NMOS transistor having a source coupled to circuit ground and a drain coupled to the second signal line. The circuit ground may be AC ground. The switch may also be implemented with a PMOS transistor or a transistor of some other type.

In an exemplary design, the apparatus may be an IC chip or a PCB on which the first, second, and third signal lines and the switch are formed. In another exemplary design, the apparatus may be a wireless device or a circuit module containing the signal lines and the switch. In yet another exemplary design, the apparatus may also comprise (i) a first IC chip on which the first, second, and third amplifiers are implemented and (ii) a second IC chip on which the first, second, and third downconverters are implemented.

Figure 8:
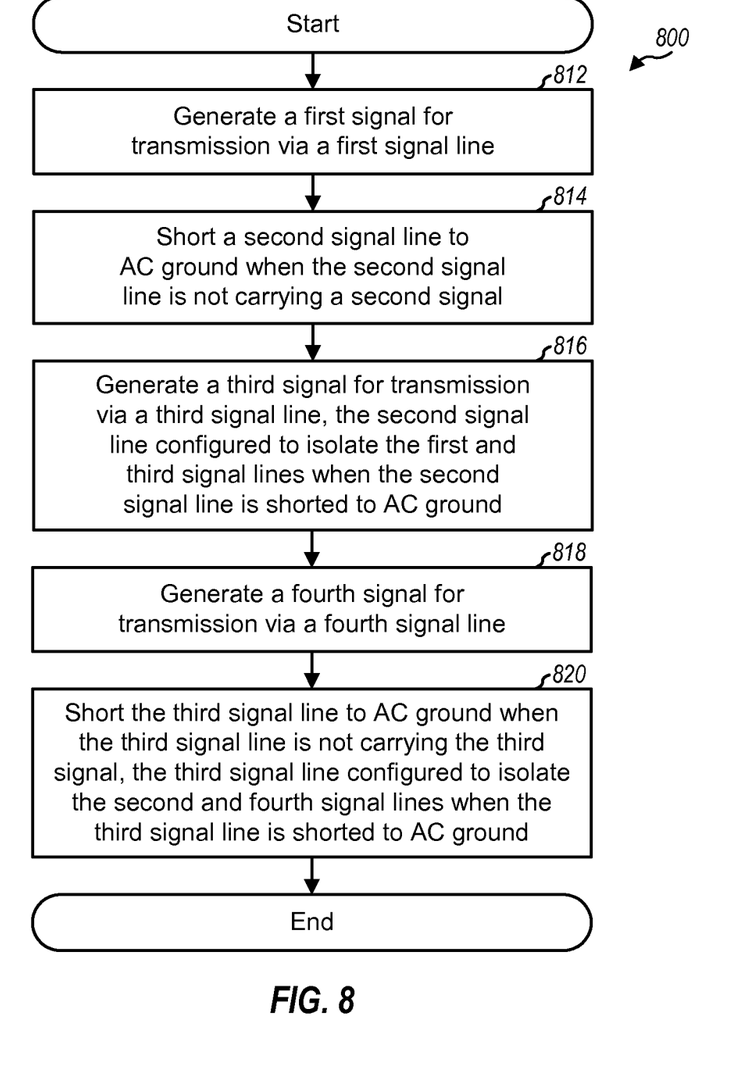
FIG. 8 shows a process for generating and routing signals with improved isolation.

FIG. 8 shows an exemplary design of a process 800 for generating and routing signals with improved isolation. A first signal may be generated for transmission via a first signal line (e.g., signal line 366 in FIG. 5A or signal line 354 in FIG. 6) (block 812). A second signal line (e.g., signal line 356 in FIG. 5A or 6) may be shorted to AC ground when the second signal line is not carrying a second signal (block 814). A third signal may be generated for transmission via a third signal line (e.g., signal line 352 in FIG. 5A or signal line 366 in FIG. 6) (block 816). The second signal line may be located between the first and third signal lines and may isolate the first and third signal lines when the second signal line is shorted to AC ground.

A fourth signal may be generated for transmission via a fourth signal line (e.g., signal line 362 in FIG. 5A or signal line 364 in FIG. 6) (block 818). The third signal line may be located between the second and fourth signal lines. The third signal line may be shorted to AC ground when the third signal line is not carrying the third signal (block 820). The third signal line may isolate the second and fourth signal lines when the third signal line is shorted to AC ground.

In an exemplary design, signal lines for each band group may be located next to each other. For example, the first and second signals may be generated for a first band group based on received signals from two antennas. The third and fourth signals may be generated for a second band group based on the received signals from the two antennas. In another exemplary design, signal lines for each band group may be located symmetric about a center line, e.g., as shown in FIG. 6. For example, the second and third signals may be generated for a first band group based on received signals from two antennas. The first and fourth signals may be generated for a second band group based on the received signals from the two antennas.

The signal lines and switches having improved isolation disclosed herein may be implemented on an IC, an analog IC, an RFIC, a mixed-signal IC, an ASIC, a PCB, an electronic device, etc. The signal lines and switches may be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the signal lines and switches disclosed herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
 a first signal line configurable to carry a first signal associated with a first set of carrier signals;
 a second signal line configurable to carry a second signal associated with a second set of carrier signals;
 a third signal line configurable to carry a third signal; and
 a first switch coupled between the second signal line and alternating current (AC) ground, the second signal line configured to isolate the first and third signal lines when the first switch is closed.

2. The apparatus of claim 1, wherein the first and second signal lines are not active concurrently, and the second and third signal lines are not active concurrently.

3. The apparatus of claim 1, wherein the first switch comprises an N-channel metal oxide semiconductor (NMOS) transistor having a source coupled to the AC ground and a drain coupled to the second signal line.

4. The apparatus of claim 1, further comprising:
 a fourth signal line configurable to carry a fourth signal, the third signal line being located between the second and fourth signal lines.

5. The apparatus of claim 4, wherein the first and second signal lines are configurable to carry the first and second signals from two antennas for a first band group, and the third and fourth signal lines are configurable to carry the third and fourth signals from the two antennas for a second band group.

6. The apparatus of claim 4, wherein the second and third signal lines are configurable to carry the second and third signals from two antennas for a first band group, and the first and fourth signal lines are configurable to carry the first and fourth signals from the two antennas for a second band group.

7. The apparatus of claim 4, further comprising:
 a second switch coupled between the third signal line and the AC ground, the third signal line configured to isolate the second and fourth signal lines when the second switch is closed.

8. The apparatus of claim 4, further comprising:
 a fifth signal line configurable to carry a fifth signal; and a sixth signal line configurable to carry a sixth signal, the first, second, third, fourth, fifth and sixth signal lines comprising a first pair of signal lines for a first band group, a second pair of signal lines for a second band group, and a third pair of signal lines for a third band group.

9. The apparatus of claim 1, wherein the first signal line comprises positive and negative signal lines having at least one cross over.

10. The apparatus of claim 1, wherein the first signal line comprises a first pair of positive and negative signal lines having an even number of cross over, and the second signal line comprises a second pair of positive and negative signal lines having an odd number of cross over.

11. The apparatus of claim 1, further comprising:
a second switch coupled between the second signal line and the AC ground, the first switch and the second switch being closed when the second signal line is not carrying the second signal.

12. The apparatus of claim 1, wherein the first signal line is configurable to carry the first signal from a first amplifier to a first downconverter, the second signal line is configurable to carry the second signal from a second amplifier to a second downconverter, and the third signal line is configurable to carry the third signal from a third amplifier to a third downconverter.

13. The apparatus of claim 12, wherein the first, second, and third amplifiers are implemented on a first integrated circuit (IC) chip, and the first, second, and third downconverters are implemented on a second IC chip.

14. A method comprising:
generating a first signal for transmission via a first signal line associated with a first set of carrier signals;
shorting a second signal line to alternating current (AC) ground when the second signal line is not carrying a second signal, the second signal line associated with a second set of carrier signals; and
generating a third signal for transmission via a third signal line, the second signal line configured to isolate the first and third signal lines when the second signal line is shorted to the AC ground.

15. The method of claim 14, further comprising:
generating a fourth signal for transmission via a fourth signal line; and
shorting the third signal line to the AC ground when the third signal line is not carrying the third signal, the third signal line configured to isolate the second and fourth signal lines when the third signal line is shorted to the AC ground.

16. The method of claim 15, wherein the second and third signals are generated for a first band group based on received signals from two antennas, and the first and fourth signals are generated for a second band group based on the received signals from the two antennas.

17. The method of claim 15, wherein the first and second signals are generated for a first band group based on received signals from two antennas, and the third and fourth signals are generated for a second band group based on the received signals from the two antennas.

18. An apparatus comprising:
means for generating a first signal for transmission via a first signal line associated with a first set of carrier signals;
means for shorting a second signal line to alternating current (AC) ground, the second signal line associated with a second set of carrier signals; and
means for generating a third signal for transmission via a third signal line, the second signal line configured to isolate the first and third signal lines when the second signal line is shorted to the AC ground via the means for shorting the second signal line.

19. The apparatus of claim 18, further comprising:
means for generating a fourth signal for transmission via a fourth signal line; and
means for shorting the third signal line to the AC ground, the third signal line configured to isolate the second and fourth signal lines when the third signal line is shorted to the AC ground via the means for shorting the third signal line.

\* \* \* \* \*